(12) United States Patent
Chang et al.

(10) Patent No.: US 7,319,624 B2
(45) Date of Patent: Jan. 15, 2008

(54) MEMORY BUILT IN SELF TEST CIRCUIT AND METHOD FOR GENERATING A HARDWARE CIRCUIT COMPRISING THE ROUTING BOXES THEREOF

(75) Inventors: Che-Chiang Chang, Jhudong Township, Hsinchu County (TW); Jian-Dai Pan, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 115 days.

(21) Appl. No.: 11/403,345

(22) Filed: Apr. 12, 2006

(65) Prior Publication Data

US 2007/0260924 A1    Nov. 8, 2007

(51) Int. Cl.
*G11C 29/00* (2006.01)
*G11C 7/00* (2006.01)

(52) U.S. Cl. .................. 365/201; 365/200; 365/189.02; 714/718; 714/733

(58) Field of Classification Search ................ 365/201, 365/200, 189.02, 198; 714/718, 733
See application file for complete search history.

(56) References Cited

U.S. PATENT DOCUMENTS

| | | | | |
|---|---|---|---|---|
| 6,243,307 B1 * | 6/2001 | Kawagoe | ................... | 365/201 |
| 6,782,498 B2 * | 8/2004 | Tanizaki et al. | ............ | 714/733 |
| 7,257,752 B2 * | 8/2007 | Chen | .......................... | 714/733 |
| 7,263,010 B2 * | 8/2007 | Iwai et al. | .................. | 365/200 |

* cited by examiner

*Primary Examiner*—Anh Phung
*Assistant Examiner*—Toan Le
(74) *Attorney, Agent, or Firm*—Winston Hsu (57) ABSTRACT

A circuit and a method for performing a memory built in self test (MBIST) are provided. The circuit comprises a plurality of routing boxes and a test controller. The test controller provides test input signals to a plurality of embedded memory blocks, receives data output signals output by the memory blocks in response to the test input signals, and verifies the data output signal based on the test input signals. The routing boxes are placed to form a common bus between the test controller and the memory blocks to transmit the signals between the test controller and the memory blocks.

16 Claims, 8 Drawing Sheets

Memory sizes       10    10    10    10    10

Routing box sizes  10 → 10 → 10 → 10 → 10

FIG. 7A

Memory sizes       12    10    8     8     6

Routing box sizes  12 → 10 → 8 → 8 → 6

FIG. 7B

Memory sizes       20    8     12    6     4

Routing box sizes  20 → 12 → 12 → 6 → 4

FIG. 7C

Memory sizes        10    8    12    4    2

Routing box sizes   12→ 12 → 12 → 4 → 2

FIG. 7D

Memory sizes        6    12    4    20    6    8    2

Routing box sizes   [ 6 ← 12 ← 12 ← 20 ↔ 8 → 8 → 2 ]

FIG. 7E

Memory sizes        4    8    6    10    8    8    6

Routing box sizes   [ 4 ← 8 ← 8 ← 10 ↔ 8 → 8 → 6 ]

Routing box sizes   [ 10 ← 10 ← 10 ← 14 ↔ 12 → 12 → 8 ]

Memory sizes        10 ← 6 ← 6 ← 14 → 10 → 12 → 8

FIG. 7F

MEMORY BUILT IN SELF TEST CIRCUIT AND METHOD FOR GENERATING A HARDWARE CIRCUIT COMPRISING THE ROUTING BOXES THEREOF

BACKGROUND OF THE INVENTION

1. Field of the Invention

The present invention relates to a circuit and a method for a memory test. More particularly, the present invention relates to a circuit and a method for a memory built in self test (MBIST).

2. Description of the Related Art

Over 70% of today's chip designs implement embedded memories, and the embedded memories are consuming more and more die area. It is estimated that in the year 2010 embedded memories will occupy more than 90% of total area of system-on-chip (SOC) designs. Therefore test of embedded memories is becoming an important issue. If the memory test is handled by external devices, a chip has to dedicate a lot of pins for transmitting signals of the test. The placing and routing (P&R) of transmission tracks connecting the dedicated pins and the embedded memories undesirably increase cost and complexity of SOC designs. In contrast, memory built in self test (MBIST) is a very efficient way to test embedded memories with a relatively low area and design impact.

Figure 1:
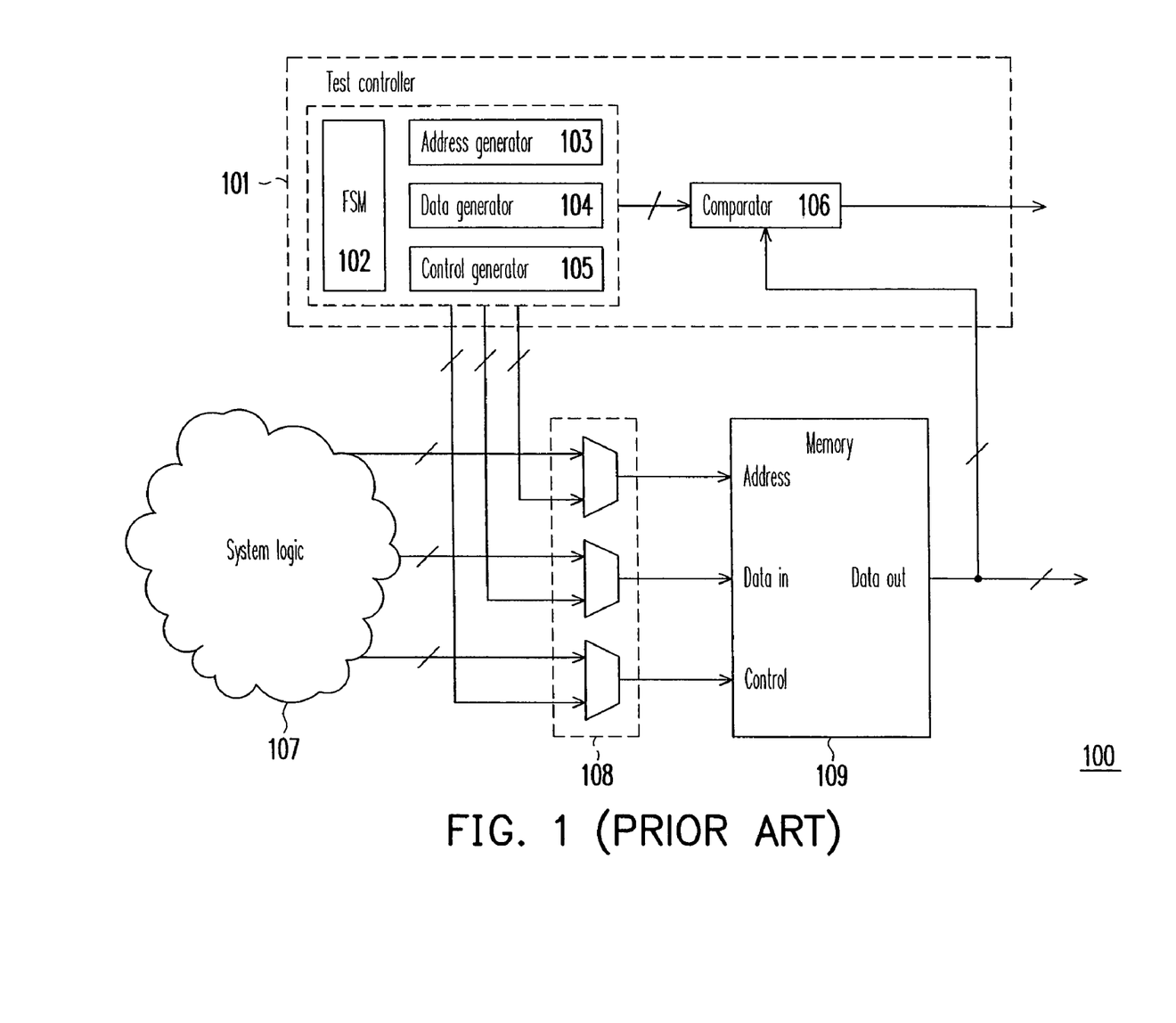
FIG. 1, FIG. 2 and FIG. 3 are schematic diagrams showing conventional MBIST circuits.

FIG. 1 is a schematic diagram showing a conventional MBIST circuit 100. The test controller 101 controls the MBIST process by providing address signals, data signals and memory control signals to the embedded memory block 109. The memory block 109 provides data output signals in response to the signals from the test controller 101.

The test controller 101 comprises a finite state machine (FSM) 102, an address generator 103, a data generator 104, a control generator 105 and a comparator 106. In brief, the address generator 103 provides the address signals. The data generator 104 provides the data signals. The control generator 105 provides the memory control signals. The comparator 106 verifies data output signals from the memory block 109 based on the signals provided by the test controller 101. The finite state machine 102 controls and coordinates the other components of the test controller 101 in order to perform the MBIST.

Apart from the MBIST, during normal operations the memory block 109 provides data output signals in response to address signals, data signals and memory control signals provided by the system logic 107. The multiplexers 108 ensures that the memory block 109 receives signals provided by the test controller 101 during an MBIST and receives signals provided by the system logic 107 during normal operations.

Figure 2:
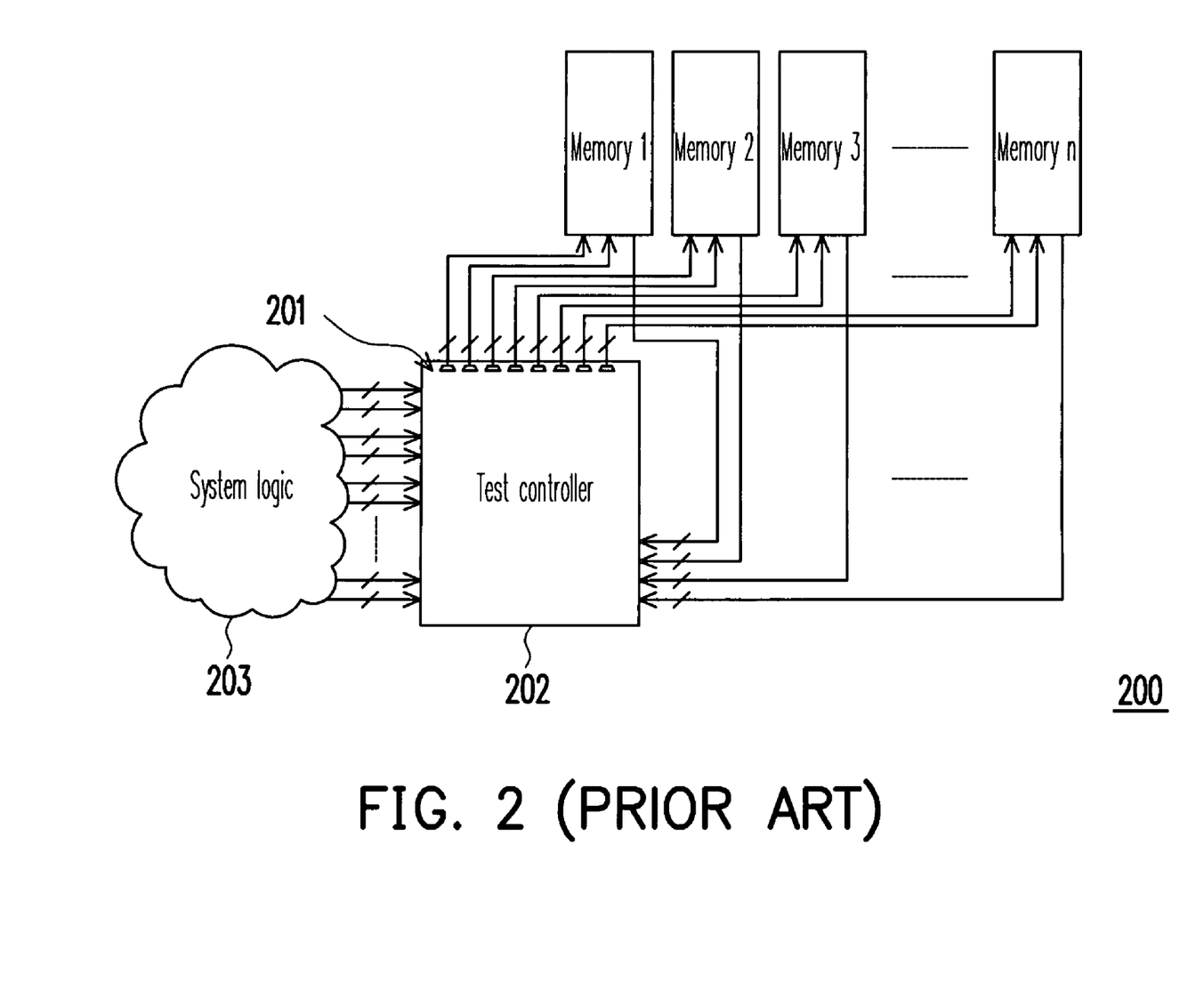

MBIST is usually performed in groups. A group includes a test controller and multiple embedded memory blocks. For example, FIG. 2 is a schematic diagram showing a conventional MBIST circuit 200 for such a group. The test controller 202 provides address signals, data signals and memory control signals through the multiplexers 201 to the memory blocks 1~n and receives data output signals from the memory blocks 1~n. Each memory block 1~n uses an individual set of transmission tracks to receive signals from the test controller 202 and to provide data output signals to the test controller 202. The test controller 202 also delivers address signals, data signals and memory control signals from the system logic 203 through the multiplexers 201 to the memory blocks 1~n.

Because each of the memory blocks 1~n uses an individual set of transmission tracks in the MBIST circuit 200, as the number of memory blocks increase, chip area can be congested with transmission tracks, complicating P&R effort.

Figure 3:
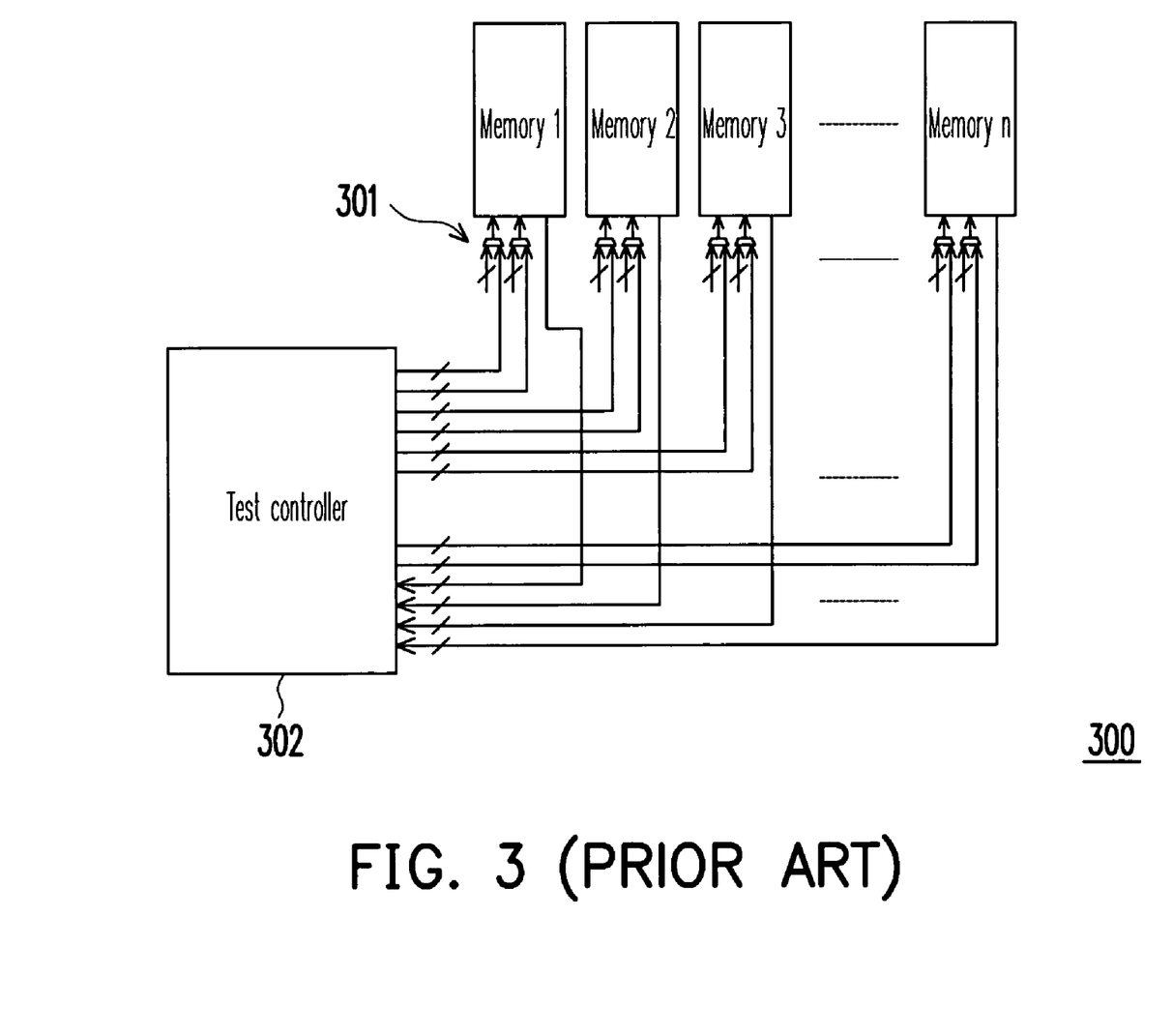

FIG. 3 is a schematic diagram showing another conventional MBIST circuit 300. The difference between the MBIST circuit 200 and the MBIST circuit 300 is that the multiplexers 201 in the MBIST circuit 200 are attached to the test controller 202 while the multiplexers 301 in the MBIST circuit 300 are placed apart from the test controller 302. The multiplexers 301 receive signals directly from the system logic (not shown in FIG. 3). Although the test controller 302 does not have to deliver signals from the system logic as the test controller 202 does, the MBIST circuit 300 still faces the same problem of routing congestion caused by too many transmission tracks.

SUMMARY OF THE INVENTION

Accordingly, the present invention is directed to an MBIST circuit. The MBIST circuit solves the routing congestion problem and facilitates P&R effort of SOC designs.

The present invention is also directed to a method for generating a hardware circuit comprising the routing boxes of the above MBIST circuit. Likewise, the purpose of the method is solving the routing congestion problem and facilitating P&R effort of SOC designs.

According to an embodiment of the present invention, an MBIST circuit is provided. The MBIST circuit comprises a plurality of routing boxes and a test controller. Each of the routing boxes is coupled to a memory block and at least one another routing box. Each of the routing boxes receives a test input signal from an immediately adjacent routing box and transmits a data output signal from the corresponding memory block to the immediately adjacent routing box. Each of the routing boxes transmits one of the test input signal and a system input signal to the corresponding memory block in response to a test control signal, and transmits one of a test output enable signal and a system output enable signal to the corresponding memory block in response to the test control signal. The test controller is coupled to one of the routing boxes for providing the test input signal to the coupled routing box and receiving the data output signal from the coupled routing box. The test controller also verifies the data output signal based on the test input signal, and provides the test control signal and the test output enable signal to all the routing boxes.

In an embodiment of the present invention, each of the routing boxes comprises an input bus, an output bus and a multiplexer module. The input bus transmits the test input signal. The output bus is coupled to the corresponding memory block for transmitting the data output signal. The multiplexer module is coupled between the input bus and the corresponding memory block. The multiplexer module transmits one of the test input signal and the system input signal to the corresponding memory block in response to the test control signal, and transmits one of the test output enable signal and the system output enable signal to the corresponding memory block in response to the test control signal. Moreover, the input buses of the immediately adjacent routing boxes are coupled together. The output buses of the immediately adjacent routing boxes are also coupled together.

In an embodiment of the present invention, if a first routing box is closer to the test controller than a second routing box is, the size of the first routing box is larger than or equal to the size of the second routing box.

According to another embodiment of the present invention, a method for generating a hardware circuit comprising the routing boxes of the above MBIST circuit is provided. The method comprises the following steps. (a) Divide a plurality of memory blocks into a least one group. And (b) for each of the group(s), generate a hardware circuit comprising at least one routing box such that one routing box is coupled to each one of the memory block(s) of the group, one routing box of the group is coupled to a test controller and, if the group comprises a plurality of routing boxes, each of the routing boxes is coupled to at least one another routing box of the same group.

In an embodiment of the present invention, the size of each of the routing boxes is larger than or equal to the size of the corresponding memory block. Additionally, if a first routing box of the group is closer to the test controller than a second routing box of the group is, the size of the first routing box is larger than or equal to the size of the second routing box.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4:
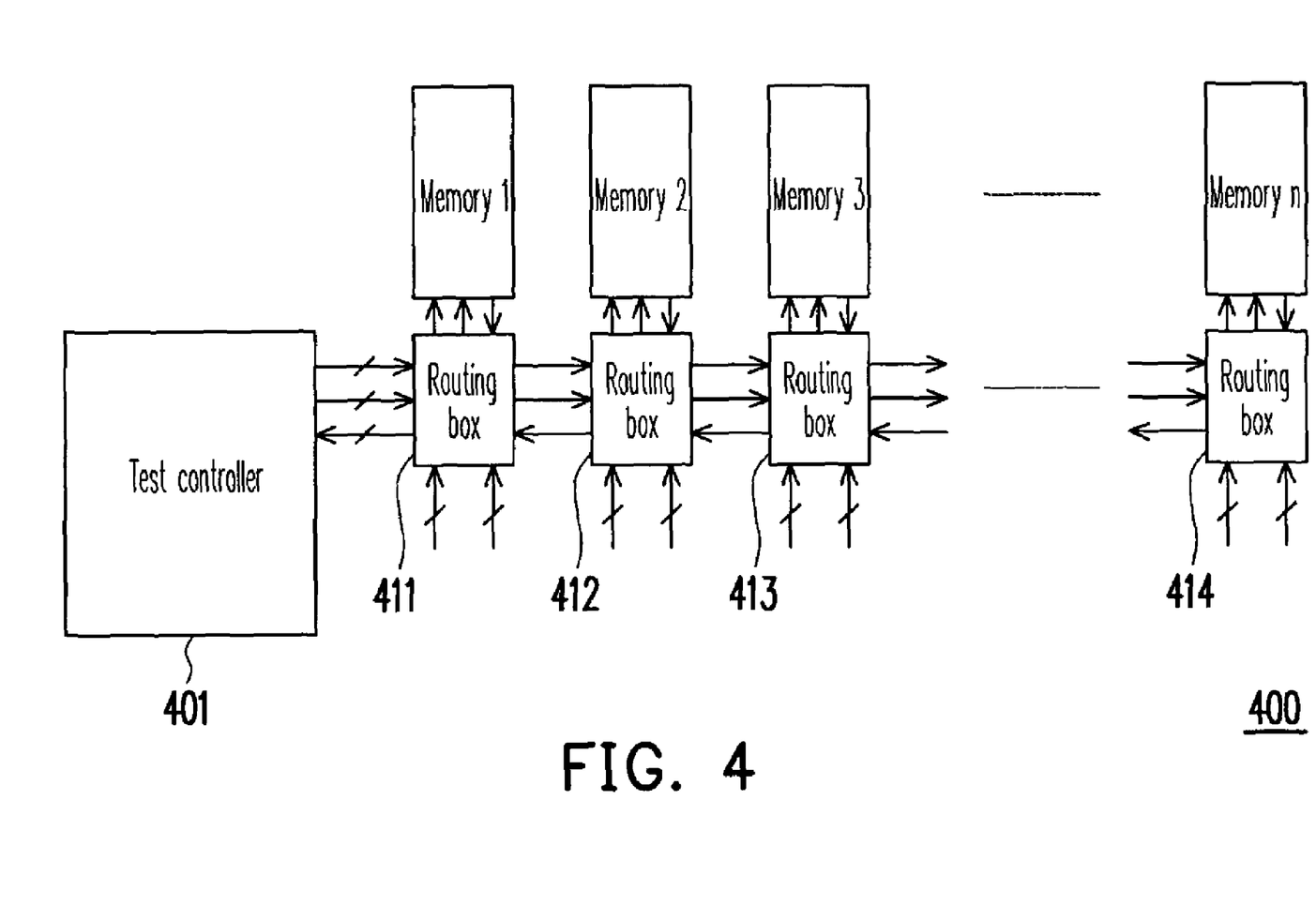
FIG. 4 is a schematic diagram showing an MBIST circuit according to an embodiment of the present invention.

FIG. 4 is a schematic diagram showing an MBIST circuit 400 according to an embodiment of the present invention. The MBIST circuit 400 comprises a test controller 401 and a plurality of routing boxes 411~414. The routing boxes 411~414 constitute a common bus between the test controller 401 and the memory blocks 1~n for transmitting various signals during an MBIST. The test controller 401 is coupled to the routing box 411 for providing test input signals to the routing box 411 and receiving data output signals from the routing box 411. The test input signals comprises test data signals, test address signals and test memory control signals. The test memory control signals comprise, for example, read/write signals and clock signals for controlling embedded memory blocks 1~n. The memory blocks 1~n output the data output signals in response to the test input signals. The test controller 401 verifies the data output signals based on the corresponding test input signals. Furthermore, the test controller 401 provides a test control signal and a plurality of test output enable signals to all the routing boxes 411~414. The significance of the test control signal and the test output enable signals will be discussed later. The test controller 401 in FIG. 4 has the same structure as the test controller 101 in FIG. 1.

The routing boxes 411~414 constitute a common bus between the test controller 401 and the memory blocks 1~n. Therefore, each of the routing boxes 411~414 is coupled to one of the memory blocks 1~n and at least one another routing box 411~411. In other words, the routing boxes are all connected directly or indirectly, and there is a one-to-one mapping between the routing boxes and the memory blocks. The routing box 411 transmits the test input signals from the test controller 401 to the 1st memory block and to the other routing boxes 412~414. The routing box 411 also transmits the data output signals from the 1st memory block and the other routing boxes 412~414 to the test controller 401. The routing box 412 transmits the test input signals from the routing box 411 to the 2nd memory block and to the routing boxes 413~414. On the other hand, the routing box 412 also transmits the data output signals from the 2nd memory block and the routing boxes 413~414 through the routing box 411 to the test controller 401. The routing boxes 413~414 work in the way as the routing box 412 does.

Figure 5:
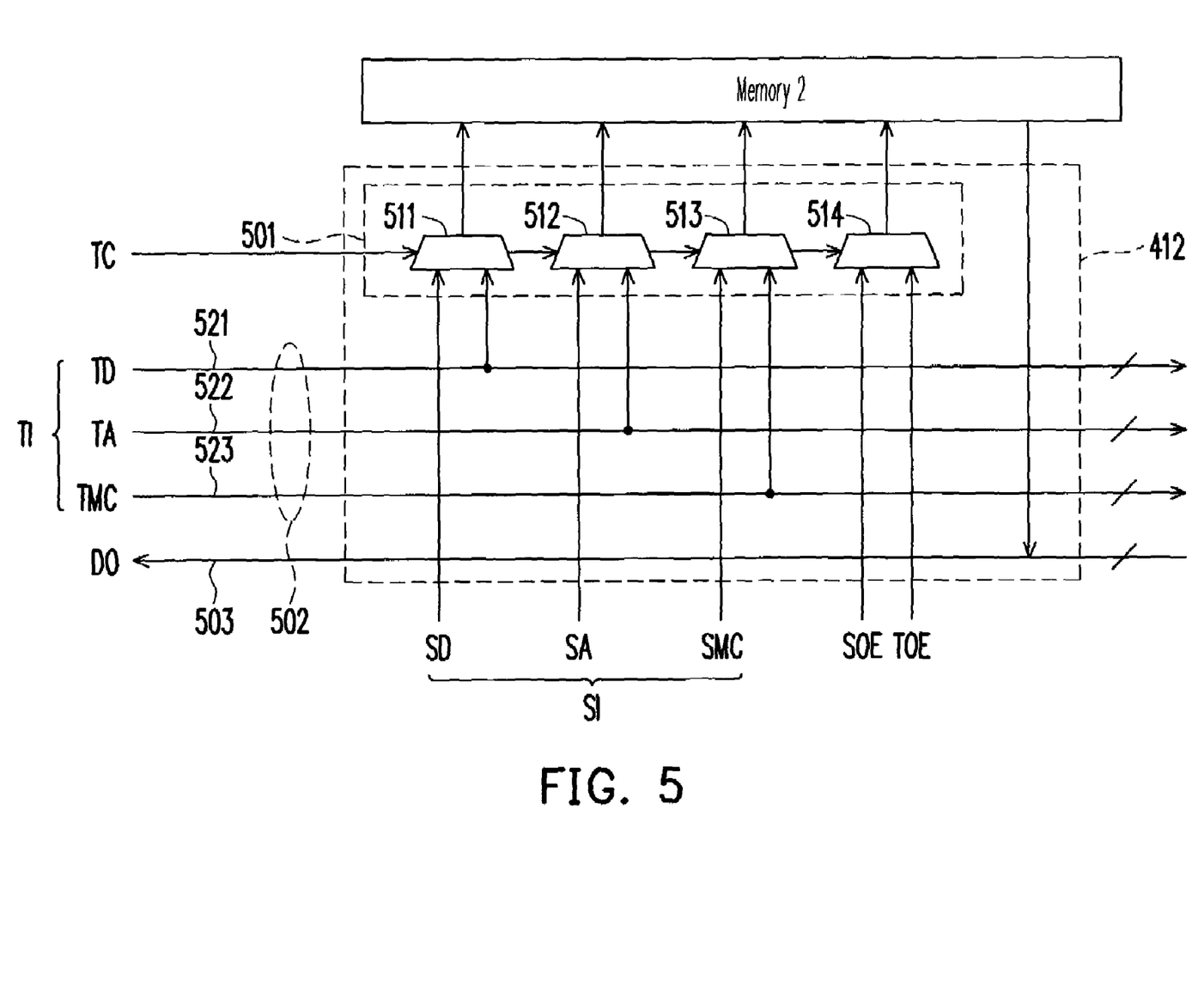
FIG. 5 is a schematic diagram showing the architecture of a routing box in FIG. 4.

The routing boxes 411~414 have the same structure. Take the routing box 412 for example; FIG. 5 is a schematic diagram showing the internal structure of the routing box 412. The routing box 412 comprises an input bus 502, an output bus 503, and a multiplexer module 501. The input bus 502 transmits the test input signals TI, which comprises the test data signals TD, the test address signals TA and the test memory control signals TMC. The output bus 503 is coupled to the 2nd memory block for transmitting the data output signals DO. The multiplexer module 501 is coupled between the input bus 502 and the 2nd memory block. The multiplexer module 501 transmits the test input signals TI from the test controller 401 or system input signals SI from the system logic (not shown in FIG. 5) to the 2nd memory block in response to the test control signal TC. The multiplexer module 501 also transmits the test output enable signal TOE from the test controller 401 and a system output enable signal SOE from the system logic to the 2nd memory block in response to the test control signal TC.

The system input signals SI comprise system data signals SD, system address signals SA and system memory control signals SMC. Similar to the test memory control signals TMC, the system memory control signals SMC also comprise, for example, read/write signals and clock signals.

The input bus 502 comprises a data bus 521 for transmitting the test data signals TD, an address bus 522 for transmitting the test address signals TA, and a control bus 523 for transmitting the test memory control signals TMC.

The multiplexer module 501 comprises four multiplexers 511~514. The first multiplexer 511 transmits the test data signals TD or the system data signals SD to the 2nd memory block in response to the test control signal TC. The second multiplexer 512 transmits the test address signals TA or the system address signals SA to the 2nd memory block in response to the test control signal TC. The third multiplexer 513 transmits the test memory control signals TMC or the system memory control signals SMC to the 2nd memory block in response to the test control signal TC. The fourth multiplexer 514 transmits the test output enable signal TOE or the system output enable signal SOE to the 2nd memory block in response to the test control signal TC.

In the other embodiments of the present invention, the routing boxes are not confined to the structure shown in FIG. 5. For example, the routing boxes may use a single bus to transmit the test address signals TA and the test memory control signals TMC. In such a case, the multiplexer module of each routing box needs only three multiplexers.

The input buses and the output buses of immediately adjacent routing boxes are all connected together. The data output function of the memory blocks 1~n is enabled by the test output enable signal TOE or the system output enable signal SOE. When the test controller 401 is going to perform an MBIST on the 2nd memory block, the test controller 401 issues the test control signal TC to inform the multiplexers 511~514 to transmit the signals provided by the test controller 401 to the 2nd memory block. Furthermore, the test controller 401 issues the test output enable signals TOE to enable the data output function of the 2nd memory block and disable the data output function of the other memory blocks so that the data output signals DO transmitted by the output buses of the routing boxes are guaranteed to be the data output signals output by the 2nd memory block. During the MBIST process, the test controller 401 and the 2nd memory block communicate by way of the routing boxes 411 and 412.

In addition to the embodiment of the MBIST circuit above, the present invention also includes a method for generating a hardware circuit comprising the routing boxes. The method is discussed below.

Figure 6:
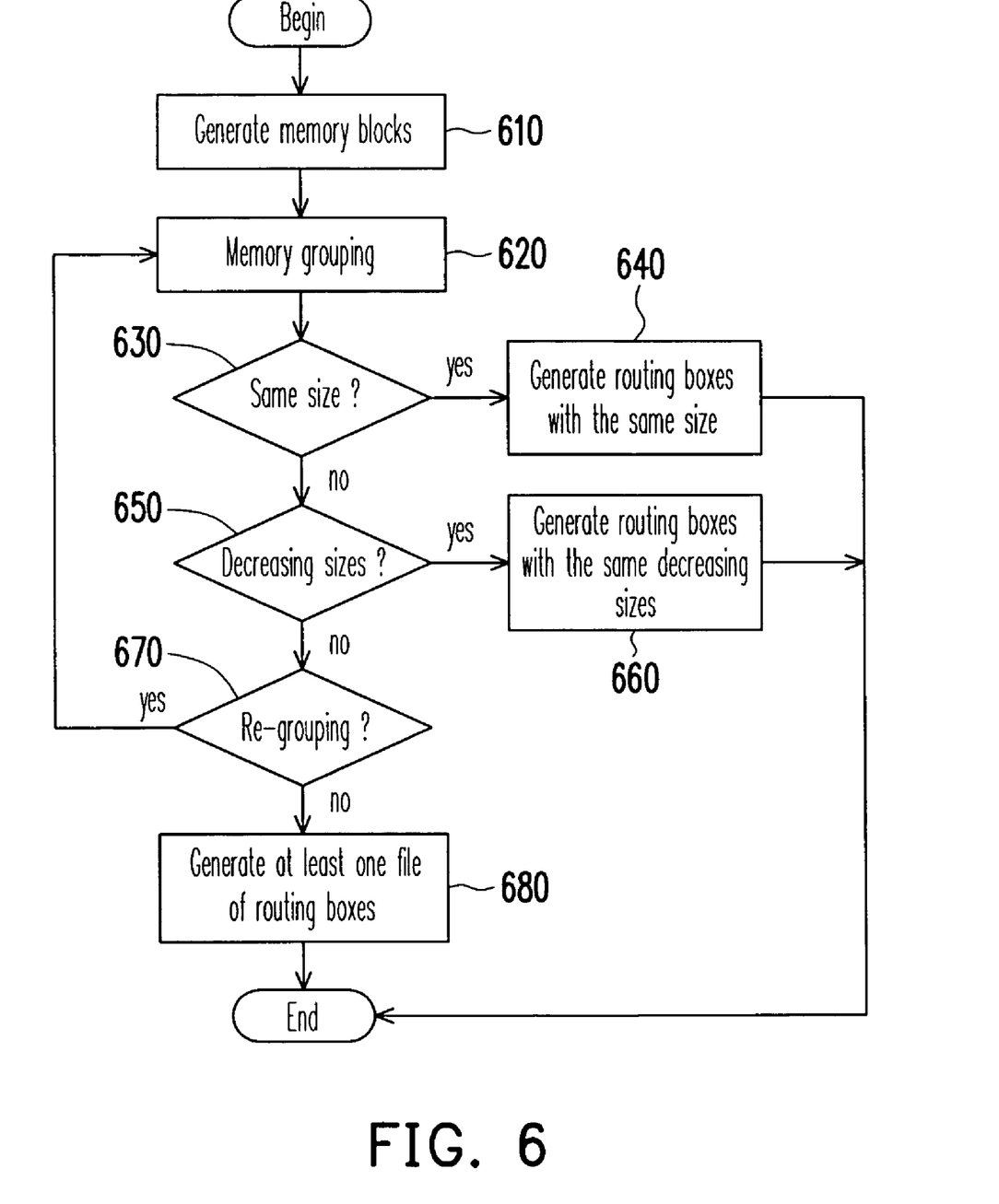
FIG. 6 is a flow chart of a method for generating a hardware circuit comprising the routing boxes of an MBIST circuit according to another embodiment of the present invention.

FIG. 6 is a flow chart of the method for generating a hardware circuit comprising the routing boxes according to another embodiment of the present invention. The flow begins at step 610.

First generate a hardware circuit comprising a plurality of embedded memory blocks using a memory compiler in step 610. The memory compiler is a piece of software for generating hardware circuits of memory blocks and routing boxes. Next, divide the memory blocks into a least one group in step 620.

Steps 630~680 are executed for each of the group(s). The general rule is as follows. For each group, the memory compiler is used to generate a hardware circuit comprising the routing box(es) of the group such that one routing box is coupled to each one of the memory block(s) of the group, one routing box of the group is coupled to a test controller. Furthermore, if a group comprises at least two routing boxes, each of the routing boxes is coupled to at least one another routing box of the same group. In other words, the routing boxes of a group are all connected directly or indirectly. There is a one-to-one mapping between the routing boxes and the memory blocks of the same group.

The sizes of the memory blocks and the sizes of the routing boxes must conform to some rules in order for the MBIST circuit to work properly. The size of each routing box must be larger than or equal to the size of its corresponding memory block. Additionally, if a first routing box of a group is closer to the test controller than a second routing box of the same group is, the size of the first routing box must be larger than or equal to the size of the second routing box. Otherwise some signals may not be able to reach their destination. Here the size of a routing box is defined to be the width of the input bus of the routing box plus the width of the output bus of the routing box. And the size of a memory block is defined to be the number of I/O terminals of the memory block that is coupled to its corresponding routing box.

Figure 7A:
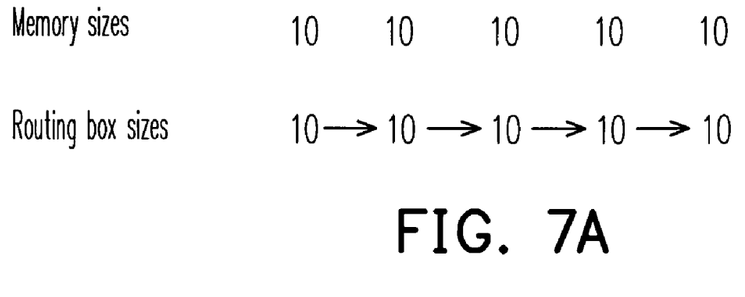
FIG. 7A to FIG. 7F are schematic examples showing various ways of applying the method in FIG. 6.

Now steps 630~680 will be discussed in details below. In step 630, check if each memory block of the current group has the same size. If the memory blocks have the same size, generate the corresponding routing boxes with the same size in step 640. FIG. 7A is a schematic example illustrating such a case. In FIG. 7A, the size of all memory blocks and routing boxes is 10. The test controller (not shown) is coupled to the leftmost routing box.

Figure 7B:
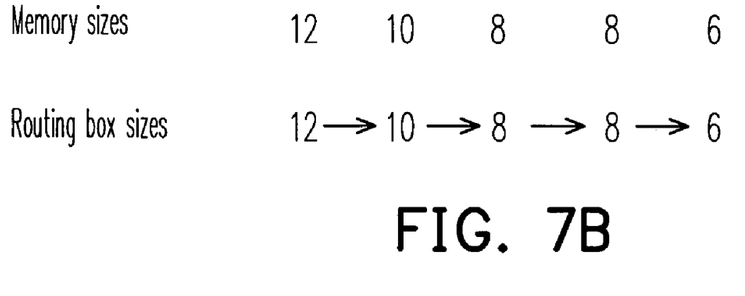
Figure 7C:
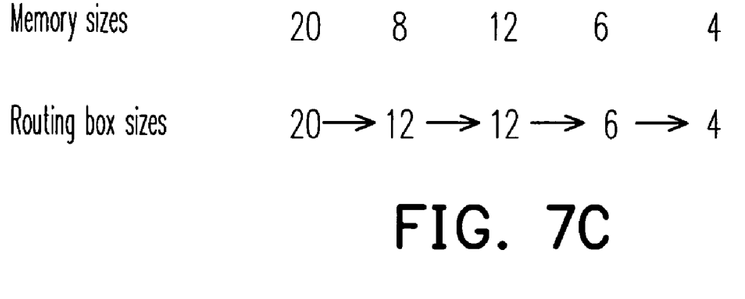

Next, if the memory blocks have different sizes, check whether the memory blocks of the group are placed as a single file with decreasing sizes in step 650. If the memory blocks have decreasing sizes, generate the corresponding routing boxes with the same decreasing sizes in step 660. FIG. 7B is a schematic example illustrating such a case. In FIG. 7B, the memory blocks have sizes 12, 10, 8, 8, 6. The routing boxes also have sizes 12, 10, 8, 8, 6. The test controller is coupled to the leftmost routing box.

Next, if the memory blocks are not placed as a single file with decreasing sizes, check whether the memory blocks can be re-grouped in step 670. If they can be re-grouped, return to step 620 in order to divide the memory blocks into different groups. The decision to re-group or not to re-group is made by considering overall cost and complexity of each individual design case.

Next, if the memory blocks cannot or should not be re-grouped, the flow proceeds to step 680 to generate the corresponding routing boxes such that the corresponding routing boxes are placed as at least one file and the routing boxes in each file have decreasing sizes. This size allocation is also a result of considering overall cost and complexity of each design case.

From FIG. 7C to FIG. 7F are schematic examples of the size allocation in step 680. First, in FIG. 7C the memory blocks have sizes 20, 8, 12, 6, 4 and the routing boxes have sizes 20, 12, 12, 6, 4. Note that the second routing box has size 12 because its size must be greater than or equal to that of the third routing box. The test controller in this example is coupled to the leftmost routing box.

Figure 7D:
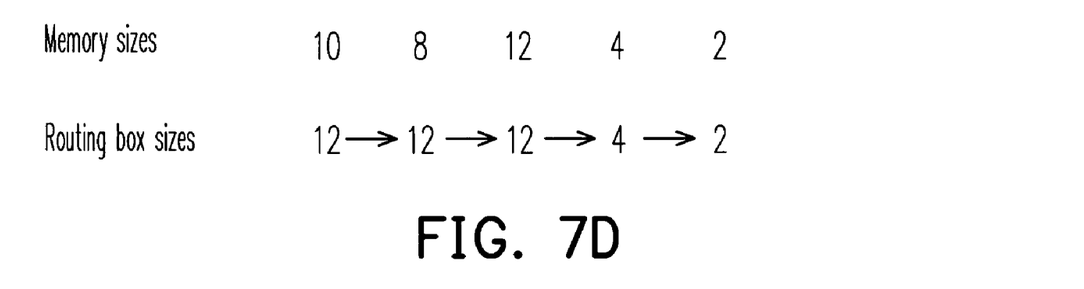

Similarly, In FIG. 7D the memory blocks have sizes 10, 8, 12, 4, 2 and the routing boxes have sizes 12, 12, 12, 4, 2. Note that the first and the second routing boxes have size 12 because their sizes cannot be smaller than that of the third routing box. The test controller in this example is also coupled to the leftmost routing box.

Figure 7E:
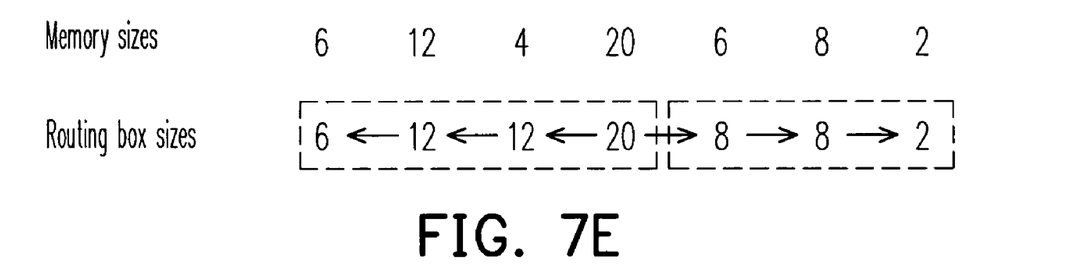
Figure 7F:
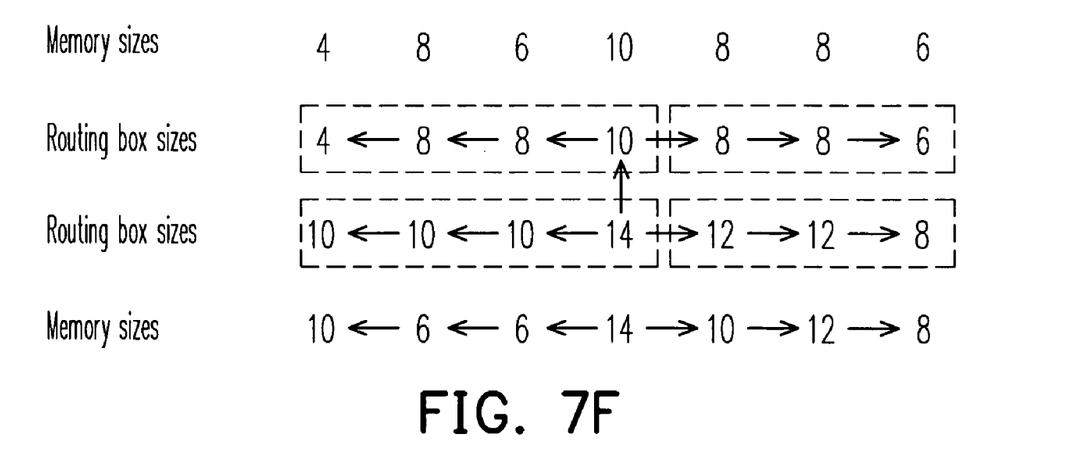

The situation in FIG. 7E is more complex. In FIG. 7E the memory blocks have sizes 6, 12, 4, 20, 6, 8, 2 and the routing boxes are placed as two files. The routing boxes of the left file have sizes 20, 12, 12, 6 and the routing boxes of the right file have sizes 8, 8, 2. Both the files conform to the size rules. The test controller in this example is coupled to the routing box with size 20.

The routing boxes in this embodiment can be configured to constitute a tree graph with a plurality of branches. For example, in FIG. 7F there are two rows of memory blocks. The upper row has sizes 4, 8, 6, 10, 8, 8, 6 and the lower row has sizes 10, 6, 6, 14, 10, 12, 8. The routing boxes are split into four files. The upper left file has sizes 10, 8, 8, 4. The upper right file has sizes 8, 8, 6. The lower left file has sizes 14, 10, 10, 10. The lower right file has sizes 12, 12, 8. All the files conform to the size rules. The test controller in this example is coupled to the routing box with size 14.

In summary, the present invention replaces conventional distributed transmission tracks with concentrated buses inside routing boxes. The routing boxes concatenate together to offer compact transmission routes. Therefore the present invention can solve the routing congestion problem of convention MBIST circuits and facilitate P&R effort of SOC designs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory built in self test (MBIST) circuit, comprising:
a plurality of routing boxes, each of the routing boxes coupled to a memory block and at least one another routing box, each of the routing boxes receiving a test input signal from an immediately adjacent routing box and transmitting a data output signal from the corresponding memory block to the immediately adjacent routing box, each of the routing boxes transmitting one of the test input signal and a system input signal to the corresponding memory block in response to a test control signal, and transmitting one of a test output enable signal and a system output enable signal to the corresponding memory block in response to the test control signal; and
a test controller coupled to one of the routing boxes for providing the test input signal to the coupled routing box and receiving the data output signal from the coupled routing box, and for verifying the data output signal based on the test input signal, the test controller also providing the test control signal and the test output enable signal to all the routing boxes.

2. The MBIST circuit of claim 1, wherein the corresponding memory block outputs the data output signal in response to the test input signal or the system input signal, and a data output function of the corresponding memory block is enabled by the test output enable signal or the system output enable signal.

3. The MBIST circuit of claim 1, wherein each of the routing boxes comprises:
an input bus for transmitting the test input signal;
an output bus coupled to the corresponding memory block for transmitting the data output signal; and
a multiplexer module coupled between the input bus and the corresponding memory block for transmitting one of the test input signal and the system input signal to the corresponding memory block in response to the test control signal, and for transmitting one of the test output enable signal and the system output enable signal to the corresponding memory block in response to the test control signal; wherein
the input buses of the immediately adjacent routing boxes are coupled together, the output buses of the immediately adjacent routing boxes are also coupled together.

4. The MBIST circuit of claim 3, additionally, if a first routing box is closer to the test controller than a second routing box is, the size of the first routing box is larger than or equal to the size of the second routing box.

5. The MBIST circuit of claim 3, wherein the test input signal comprises a test data signal, a test address signal and a test memory control signal, the system input signal comprises a system data signal, a system address signal and a system memory control signal.

6. The MBIST circuit of claim 5, wherein the test memory control signal comprises at least one of a first read/write signal and a first clock signal, the system memory control signal comprises at least one of a second read/write signal and a second clock signal.

7. The MBIST circuit of claim 5, wherein the test controller comprises:
an address generator for providing the test address signal;
a data generator for providing the test data signal;
a control generator for providing the test memory control signal;
a comparator for verifying the data output signal based on the test input signal; and
a finite state machine for controlling and coordinating the address generator, the data generator, the control generator and the comparator.

8. The MBIST circuit of claim 5, wherein the input bus comprises:
a data bus for transmitting the test data signal;
an address bus for transmitting the test address signal;
a control bus for transmitting the test memory control signal;
and the multiplexer module comprises:
a first multiplexer for transmitting one of the test data signal and the system data signal to the corresponding memory block in response to the test control signal;
a second multiplexer for transmitting one of the test address signal and the system address signal to the corresponding memory block in response to the test control signal;
a third multiplexer for transmitting one of the test memory control signal and the system memory control signal to the corresponding memory block in response to the test control signal; and
a fourth multiplexer for transmitting one of the test output enable signal and the system output enable signal to the corresponding memory block in response to the test control signal.

9. A method for generating a hardware circuit comprising the routing boxes of claim 1, comprising:
(a) dividing a plurality of memory blocks into a least one group; and
(b) for each of the group(s), generating a hardware circuit comprising at least one routing box such that one routing box is coupled to each one of the memory block(s) of the group, one routing box of the group is coupled to a test controller and, if the group comprises a plurality of routing boxes, each of the routing boxes is coupled to at least one another routing box of the same group.

10. The method of claim 9, before step (a) further comprising:
generating a hardware circuit comprising the memory blocks.

11. The method of claim 9, wherein the size of each of the routing boxes is larger than or equal to the size of the corresponding memory block.

12. The method of claim 11, additionally, if a first routing box of the group is closer to the test controller than a second routing box of the group is, the size of the first routing box is larger than or equal to the size of the second routing box.

13. The method of claim 12, wherein step (b) further comprises:
if each memory block of the group has the same size, generating the corresponding routing boxes with the same size.

14. The method of claim 12, wherein step (b) further comprises:
if the memory blocks of the group are placed as a single file with decreasing sizes, generating the corresponding routing boxes with the same decreasing sizes.

15. The method of claim 12, wherein step (b) further comprises:
if the memory blocks of the group are not placed as a single file with decreasing sizes, dividing the memory blocks into different groups and returning to step (a).

16. The method of claim 12, wherein step (b) further comprises:
if the memory blocks of the group are not placed as a single file with decreasing sizes, generating the corresponding routing boxes such that the corresponding routing boxes are placed as at least one file and the routing box(es) in each of the file(s) have decreasing size(s).

* * * * *